United States Patent [19]

Berlin

[11] Patent Number: 5,366,813
[45] Date of Patent: Nov. 22, 1994

[54] TEMPERATURE COEFFICIENT OF RESISTANCE CONTROLLING FILMS

[75] Inventor: Carl W. Berlin, Bringhurst, Ind.

[73] Assignee: Delco Electronics Corp., Kokomo, Ind.

[21] Appl. No.: 57,921

[22] Filed: May 7, 1993

Related U.S. Application Data

[62] Division of Ser. No. 806,193, Dec. 13, 1991, abandoned.

[51] Int. Cl.⁵ .............................................. H01B 1/02
[52] U.S. Cl. ................................. 428/546; 428/901; 156/90; 252/514
[58] Field of Search .................. 428/901, 546; 156/90; 252/514

[56] References Cited

U.S. PATENT DOCUMENTS

| | | | |
|---|---|---|---|
| 3,232,886 | 9/1962 | Hoffman | 252/514 |
| 3,909,680 | 9/1975 | Tsunashima | 317/101 |
| 4,728,534 | 8/1986 | Ho | 427/103 |
| 4,831,432 | 5/1989 | Hori et al. | 357/67 |
| 5,221,644 | 7/1993 | Berlin | 501/19 |

*Primary Examiner*—Donald P. Walsh
*Assistant Examiner*—Anthony R. Chi
*Attorney, Agent, or Firm*—Cary W. Brooks; Mark A. Navarre

[57] ABSTRACT

A conductor runner composition is disclosed for using combination with resistors to limit and control the temperature coefficient resistance tracking of the resistors over varying temperatures. The conductor runner composition includes less than 60 weight percent silver powder which limits the amount of silver diffusing into the resistor at the resistor/conductor termination and thus reduces the effect of resistor/conductor interactions on the temperature coefficient of resistance of a resistor. The conductor has an extremely low TCR and resistivity combination.

2 Claims, 1 Drawing Sheet

TEMPERATURE COEFFICIENT OF RESISTANCE CONTROLLING FILMS

This is a division of application Ser. No. 07/806193 filed on Dec. 13, 1991 now abandoned.

FIELD OF THE INVENTION

This invention relates to conductor films and more particularly to conductor films used in combination with resisters to control the temperature coefficient of resistance tracking of the resistor over a wide range of temperatures.

BACKGROUND

Most electronic components are affected by changes in temperature. Resisters and capacitors, for example, change value when the temperature varies over a wide range. The tendency of a component to change in value with temperature variations is known as temperature coefficient. Thus, for resisters, there is a temperature coefficient of resistance which varies in value with temperature variations. The temperature coefficient (TC or tempcos) is usually expressed parts per million per degree Celsius (ppm/deg C).

A resistor is a circuit component that provides a fixed value of resistance in ohms to oppose the flow of electrical current. A resistor can control or limit the amount of current flowing in a circuit, provide a voltage drop in accordance with ohms law, or dissipate energy as heat. Naturally, the design of any electrical device is prefaced on the anticipation that specific components such as resisters will have properties which fluctuate in a limited and desirable amount over varied operating temperatures. For automotive electronic components, it is desirable that resistors within an electronic device have a resistance which varies within a desired range over an operating temperature ranging from −40° C. to 125° C.

A variety of compositions are known for making conductor and resistor films. Heretofore, it has been generally accepted that a conductor film should have good adhesion to a substrate, relatively low sheet resistivity and relatively low Pd content toe provide good solderability. However, such conductors have not been effective in controlling the TCR tracking of resistors that they are terminated to.

Thus, there is a need for systems which can limit the temperature coefficient resistance variation (known as Temperature Coefficient of Resistance tracking or TCR tracking) of resistors with respect to temperature.

SUMMARY OF THE INVENTION

The invention includes a conductor film composition which limits the TCR tracking of resistors terminated thereto over varying temperatures. The conductor film has an extremely low TCR and sheet resistivity combination wherein the TCR is less than 100 ppm/C at 125° C. and the TCR at −40° C. is less than 100 ppm/C, the resistivity is less than 40 milliohms/sq. The low TCR and resistivity combination eliminates the effect of the conductor runner length on the observed TCR of the resistor. The film may have a relatively low silver content which is preferably less than 60 weight percent. The low silver content in the conductor film reduces the amount of silver diffusing into the resistor and thus reduces the effect of resistor/conductor interactions on the TCR of the resistor.

The conductor runner composition of the present invention may include a silver powder in an amount ranging from about 30 to less than 60 weight percent; a glass powder in an amount ranging from about 0.1 to about 20 weight percent; a screening agent in an amount ranging from about 5 to about 35 weight percent; and a thinner in an amount ranging from about 0 to about 1 weight percent of the composition. The conductor runner composition may also include palladium in an amount ranging from about 40 to about 90 weight percent of the composition. The palladium to silver weight ratio may range from 55/45 to 60/40. The palladium and silver together may be present in an amount ranging from about 40 to about 87 weight percent of the composition. The solids contents may range from about 65 to about 93 weight percent of the composition.

Preferably, the conductor film limits the TCR tracking of thick resistors of varying geometries to less than 15 ppm/C over a temperature range of −40° C. to 125° C. The invention includes the conductor film composition and methods of making and using the same.

The invention includes the discovery that the observed TCR of a resistor is not only a function of resistor ink itself but is also dependent upon the termination material such as the conductor runner connecting to the resistor. The invention includes the discovery that during the firing of a resistor printed over a conductor runner, the conductor material diffuses into the resistor to form an interface region that has electrical properties different from the bulk of the resistor. The invention includes the discovery that the impact of this interface region on the observed TCR of a resistor will depend upon the extent of the reaction into the resistor and the resistor length. The invention includes the discovery that certain attributes of the conductor material may minimize the impact of resistor/conductor interactions and runner length effects on TCR tracking of a resistor. The invention includes the discovery that extremely low TCR and resistivity combinations of the conductor material eliminates the effect of conductor runner length on observed TCR of a resistor. The invention includes the discovery that limiting the amount of silver in a conductor composition will limit the diffusing of the silver into the resistor and thus reduce the effect of resistor/conductor interactions on TCR tracking of the resistor. The invention includes the discovery that a composition with extremely low glass content and high Pd content can be effectively used as a conductor.

These and other features, objects and advantages of the invention will become apparent from the following detailed description, and appended claims and drawings.

DETAILED DESCRIPTION

Figure 1:
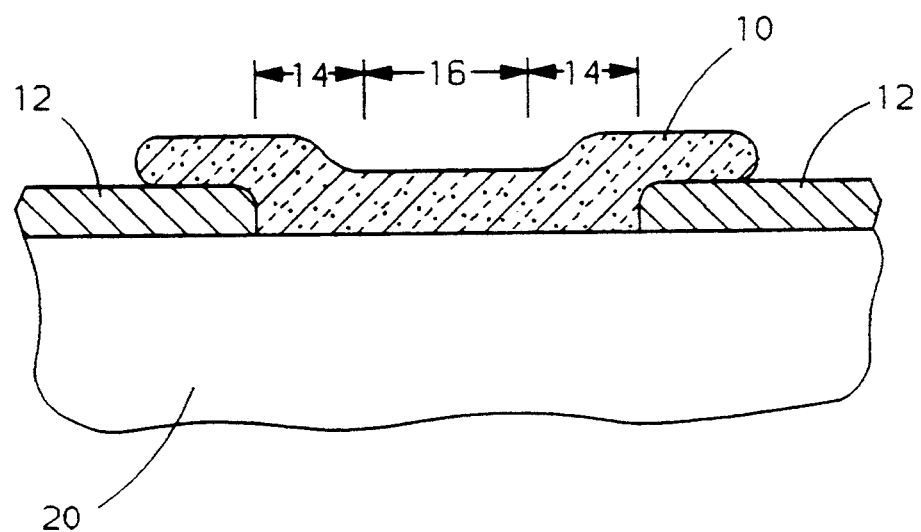
FIG. 1 is an illustration of a conductor runner resistor combination including interface regions between the resistor and conductor runner.

The temperature coefficient of resistance (TCR) of a resistor is a measurement of the resistance dependence on temperature. TCR is calculated using the relationship:

$$TCR = [(R_{25} - R_T)/(R_{25}X(25° C. - T))] \times 10^6 \qquad (1)$$

where TCR is expressed as ppm/C and $R_{25}$ is the resistance at room temperature (25° C.) in ohms, $R_T$ is the resistance at the measurement temperature in ohms, and T is the measurement temperature in degrees C.

Often, operating temperatures of a device may range from −40° C. to 125° C. The TCR tracking of a set of resistors is the maximum difference in TCR values between any two resistors on a circuit at a given temperature.

The observed TCR of a resistor is not only a function of resistor ink itself but also is dependent upon the termination material such as the conductor runner. A typical resistor/conductor combination is illustrated in FIG. 1 including a substrate 20 having a resistor 10 printed thereon which terminates at each end to a conductor runner 12. Also illustrated are interface regions 14 near each end of the resistor near the termination point. The interface region 14 is the area of the resistor susceptible to diffusion of silver from the conductor.

In preparation of the combination, the conductor is printed and fired prior to printing and firing of the resistor material. The conductor may be fired in a conventional manner, for example, at about 850° C. peak over one hour cycle. During the resistor firing, the conductor material diffuses into the resistor to form an interface region 14 that has electrical properties different from the bulk of the resistor 16. The impact of this interface region on the observed TCR will depend upon the extent of the diffusion of the conductor material into the resistor and the resistor length. The longer the resistor, the less influence on the observed TCR. For low value resistors, the high TCR of the conductor runner will raise the observed TCR above the bulk value of the resistor. Longer runners will have the greatest impact on the observed TCR.

The observed TCR dependence upon these factors is given by the relationship:

$$TCR_{(obs)} = \frac{TCR_{(res)} \times R_{(res)} + TCR_{(cond)} \times R_{(cond)} + TCR_{(int)} \times R_{(int)}}{R_{(res)} + R_{(cond)} + R_{(int)}} \quad (2)$$

where $TCR_{(obs)}$ the observed TCR in ppm/C; $TCR_{(res)}$ $TCR_{(cond)}$ and $TCR_{(int)}$ are the TCRs' at a given temperature of the bulk portion of resistor, conductor and interface region of the resistor respectively; and $R_{(res)}$, $R_{(cond)}$ and $R_{(int)}$ are the resistances at a given temperature of the bulk portion of the resistor, conductor, and the interface region of the resistor respectively.

EXAMPLE I

A conductor runner composition available from DuPont Corporation under the trade name 7484 containing about 85–90 weight percent silver and palladium in a weight ratio of 3:1 respectively was printed and fired on a substrate. The conductor runner material had a sheet resistivity $R_{(cond)}$ of 19 milliohms/sq and a TCR at 125° C. equal to +403 ppm/C. On top of the fired conductor runner was printed a resistor composition available from DuPont Corporation under the trade name 1721 containing Ruthenium oxides and glass was printed and fired. The resistor composition had a sheet resistance $R_{(res)}$ = 100 ohms/sq and a TCR at 125° C. equal to +25 ppm/C. The conductor runner influence on TCR tracking for DuPont 7484 conductors terminating to two DuPont 1721 resistors of different resistance values was calculated using equation 2 and is summarized in Table 1.

TABLE 1

| Number of Square for DuPont 7484 | TCR (observed at 125C) | | |
|---|---|---|---|
| | 10 ohm Resistor | 2 Kohm Resistor | TCR Tracking |
| 10 | 32 | 25 | 7 |
| 5 | 29 | 25 | 4 |

The DuPont 7484 conductor composition accounts for up to 7 ppm/C of the TCR tracking between the 10 ohm and 2 Kohm resistors. The longer conductor runner resulted in a greater TCR. Compare this to the results in Table 3.

EXAMPLE II

This example illustrates the impact of resistor/conductor interactions on TCR tracking for DuPont 7484 conductors and DuPont 1721 resistors. Here, the TCR dependents on resistor geometry was measured while the runner effect on TCR was suppressed by covering the conductor runners with solder. By covering the conductors with solder, the conductor resistance is so low that its high TCR will not influence the observed TCR of the resistor. The influence of resistor/conductor interactions on TCR at 125° C. is illustrated in Table 2.

TABLE 2

| Aspect Ratio L:W | TCR at 125C |
|---|---|
| 1:5 | 77 |
| 1:4 | 74 |
| 1:3 | 74 |
| 1:2 | 75 |
| 1:1 | 75 |
| 2:1 | 67 |
| 3:1 | 61 |
| 4:1 | 60 |
| 5:1 | 58 | where the aspect ratio is the ratio of the length (L) of the resistor over the width (w) of the resistor.

As can be seen in Table 2, the TCR increases as the resistor aspect ratio (L:W) is reduced. This is caused by diffusion of silver into the resistor creating an interface region with a relatively high TCR. In other words, $TCR_{(int)}$ and $R_{(int)}$ are influencing $TCR_{(obs)}$ in equation 2. The TCR tracking between the 1:5 and 5:1 geometry resistors, is 19 ppm/C. The combined effects of runner length and resistor/conductor interaction results in a TCR tracking value of 26 ppm/C (the addition of 7 ppm/C tracking from Table 1 to the 19 ppm/C tracking of Table 2).

The present invention overcomes the significant variation of TCR tracking associated with conductor/resistor combinations of the past. In the present invention, a conductor composition has been developed to minimize the impact of resistor/conductor interactions and the conductor runner effects on TCR tracking. There are two properties of the conductor composition which act to control the TCR tracking of the resistors terminated to the conductor runners made therefrom.

The first property is an extremely low TCR and resistivity combination. The resistivity of the conductor may be less than about 40 milliohms/sq, preferably ranging from about 38 to about 60 and most preferably from about 55 to about 60. The TCR of the conductor at 125° C. may be less than about 100 ppm/C, preferably ranging from about 50 to about 100 and most preferably about 60 to about 80. The TCR for the conductor runner at −40° C. should be less than about 100, preferably ranging from about 50 to about 100, and most preferably about 60 to about 80. A conductor runner having this extremely low TCR resistivity combination will operate to eliminate the effect of runner length on the observed TCR of the resistor. The influence of the conductor runner length on TCR, for a conductor prepared accordingly to the present invention, is illustrated in Table 3. The TCR values are calculated using the above equation 2.

TABLE 3

| Number of Square for | TCR (observed at 125C) | | |
|---|---|---|---|
| | 10 ohm Resistor | 2 Kohm Resistor | TCR Tracking |
| 10 | 25 | 25 | 0 |
| 5 | 25 | 25 | 0 |

The conductor runner had a composition of that set forth in Example III described hereafter and the resistor was prepared from a resistor composition available from DuPont Corporation under the trade name 1721. As shown in Table 3, all resistors had the same TCR, and the TCR was not affected by conductor runner length.

Because the TCR of the conductor prepared from the composition according to the present invention is close to that of the resistors, the length of the conductor runner does not influence the observed TCR of the resistor. Therefore, the impact of conductor runner length on TCR tracking has been eliminated.

The second important property of the conductor composition of the present invention is its relatively low silver content. The conductor composition may have a silver content which is less than 60, preferably ranging from about 30 to about 50, and most preferably about 34 to about 45 weight percent of the conductor runner composition. The relatively low silver content of the conductor runner reduces the amount of silver diffusing into the resistor and thus reduces the effect of resistor/conductor interactions on TCR. The influence of a resistor/conductor interaction on TCR is illustrated in Table 4. Here, the conductor runner composition is that set forth in Example III described hereafter, and the resistor is prepared from a resistor composition available from DuPont under the trade name 1721.

TABLE 4

| Aspect Ratio L:W | TCR at 125C |
|---|---|
| 1:5 | 64 |
| 1:4 | 62 |
| 1:3 | 58 |
| 1:2 | 67 |
| 1:1 | 68 |
| 2:1 | 61 |
| 3:1 | 61 |
| 4:1 | 58 |
| 5:1 | 54 |

For the aspect ratio is the ratio of the length (L) of the resistor over the width (w) of the resistor.

As can be see in Table 4, the TCR is not affected by the geometry of the resistor to the extent observed when the resistor was terminated to a conductor made from DuPont 7484. The tracking between the geometry extremes is only 10 ppm/C as compared to 19 ppm/C using DuPont 7484. The combined conductor runner effect and the interaction effect results in a TCR tracking of 10 ppm/C which is a remarkable improvement over the 26 ppm/C observed using a conductor runner from a composition of DuPont 7484.

The conductor runner composition of the present invention may include a silver powder in an amount ranging from about 34 to less than 60 weight percent; a glass powder in an amount ranging from about 0.1 to about 20 weight percent; a screening agent in an amount ranging from about 5 to about 35 weight percent; and a thinner in an amount ranging from about 0 to about 1 weight percent of the composition. The conductor runner composition may also include palladium in an amount ranging from about 40 to about 87 weight percent of the composition. The palladium to silver weight ratio may range from 55/45 to 60/40. The palladium and silver together may be present in an amount ranging from about 40 to about 87 weight percent of the composition. The solids contents may range from about 65 to about 93 weight percent of the composition. The palladium and silver powders have particle sizes of about 0.6–0.9 microns and 1.2 microns, respectively. Suitable palladium and silver powder are available from Metz Corporation under the trade names No. 3102 and No. 3000-1, respectively. The glass powder may include the following components:

$SiO_2$, $Al_2O_3$, CaO and PbO and has a particle size of about 9 microns. A suitable glass powder is available from Ferro Corporation under the trade name EG2778 comprising about 55 to about 57 weight percent $SiO_2$, about 16 to about 18 weight percent PbO, about 8 to about 10 weight percent $Al_2O_3$, about 7 to about 9 weight percent CaO, about 4 to about 6 weight percent $B_2O_3$, about 1.5 to about 2.5 weight percent $Na_2O$, about 1.5 to about 2.5 weight percent $K_2O$, and about 0.5 to about 1.5 weight percent MgO. The screening agent generally includes an organic binder and solvent. A suitable screening agent may be prepared from the following:

45.6% DuPont 9506
45.6% DuPont 8250
5% Igepal
3.8% Ethyl Cellulose N-200

The unique properties of this screening agent and the large particle size of the powders allows for higher than normal solids contents in the conductor paste which is approximately 91.5% solids. This keeps the film's resistivity at an extremely low level.

EXAMPLE III

A suitable composition for the conductor runner according to the present invention is as follows:

51.9% Palladium Powder
34.7% Silver Powder
5.4% Glass Powder
7.8% Screening Agent
0.2% Thinner When some aspect of the invention is defined herein in terms of ranges or proportions, such is intended to convey the invention as including the entire range and any sub-range or multiple sub-range within the broad range. For example, wherein the invention is defined as including 5-95 weight percent component A, such is intended to convey the invention as including 5-25 weight percent A, 75-95 weight percent A and 20-80 weight percent A.

The embodiments of the invention in which an exclusive property or privilege is claimed are defined as follows:

1. A conductor composition comprising:
   51.9% palladium powder,
   34.7% silver powder,
   5.5% glass powder,
   7.8% screening agent and
   0.2% by weight thinner.

2. A hybrid circuit including at least one thick film resistor, a thick film conductor runner in contact with said thick film resistor, and an interface region between said conductor and resistor formed by diffusion of conductor material into said resistor during firing of said conductor runner, said resistor and conductor having a combined temperature coefficient of resistance (TCR) parameter that varies in dependence upon TCR and resistivity parameters of said resistor, said conductor runner and said interface region, the improvement wherein:

said conductor runner is formed of a material comprising silver and palladium in a silver-to-palladium weight ratio from about 55/45 to about 60/40 so as to minimize diffusion of silver into said resistor during firing of said conductor runner while also minimizing the TCR parameter of said conductor runner, whereby said combined TCR parameter primarily depends on the TCR parameter of said thick film resistor.

* * * * *